US012571854B2

(12) United States Patent
Kondo

(10) Patent No.: US 12,571,854 B2
(45) Date of Patent: Mar. 10, 2026

(54) SYSTEM AND METHOD FOR BATTERY SELF DISCHARGE MONITORING

(71) Applicant: SEMICONDUCTOR COMPONENTS INDUSTRIES, LLC, Scottsdale, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 132 days.

(21) Appl. No.: 18/431,493

(22) Filed: Feb. 2, 2024

(65) Prior Publication Data

US 2025/0251459 A1      Aug. 7, 2025

(51) Int. Cl.
| | |
|---|---|
| *G01R 31/392* | (2019.01) |
| *G01R 19/10* | (2006.01) |
| *G01R 31/36* | (2020.01) |
| *G01R 31/374* | (2019.01) |
| *G01R 31/3842* | (2019.01) |
| *G01R 31/385* | (2019.01) |
| *G01R 31/389* | (2019.01) |

(52) U.S. Cl.
CPC ........... *G01R 31/392* (2019.01); *G01R 19/10* (2013.01); *G01R 31/3646* (2019.01); *G01R 31/374* (2019.01); *G01R 31/3842* (2019.01); *G01R 31/386* (2019.01); *G01R 31/389* (2019.01)

(58) Field of Classification Search
None
See application file for complete search history.

(56) References Cited

U.S. PATENT DOCUMENTS

| | | | |
|---|---|---|---|
| 2012/0056596 A1* | 3/2012 | Yamada | G01R 31/367 |
| | | | 320/134 |
| 2013/0311117 A1 | 11/2013 | Chaturvedi et al. | |
| 2017/0153290 A1 | 6/2017 | Sazhin et al. | |
| 2018/0095141 A1 | 4/2018 | Wild et al. | |
| 2021/0208208 A1 | 7/2021 | Yazami | |
| 2021/0263108 A1 | 8/2021 | Li et al. | |
| 2022/0123581 A1 | 4/2022 | Clarke et al. | |
| 2023/0163602 A1 | 5/2023 | Liu et al. | |
| 2023/0208166 A1 | 6/2023 | Petersen et al. | |
| 2024/0426919 A1* | 12/2024 | Gao | G01R 31/52 |

* cited by examiner

*Primary Examiner* — Jas A Sanghera
(74) *Attorney, Agent, or Firm* — Dickinson Wright PLLC; James P. Purrington, Jr.

(57) ABSTRACT

Monitoring a self-discharge resistance of a battery. Example embodiments include methods for monitoring a status of the battery, including: determining, based on a battery voltage and a battery current, a total energy loss in the battery through a plurality of charge cycles and a plurality of discharge cycles; determining an energy loss due to an internal resistance of the battery during the plurality of charge cycles and the plurality of discharge cycles; determining, based on a difference between the total energy loss and the energy loss due to the internal resistance of the battery, a self-discharge energy due to a self-discharge resistance of the battery; and generating, based on the self-discharge energy, a signal indicative of the self-discharge resistance of the battery.

21 Claims, 6 Drawing Sheets

SYSTEM AND METHOD FOR BATTERY SELF DISCHARGE MONITORING

BACKGROUND

Rechargeable batteries, such as Lithium-ion batteries, are utilized in various applications. Many types of rechargeable batteries have volatile and/or toxic components, such as flammable materials, oxidizers, etc., and which can be damaged by external and/or internal forces. An example of such internal forces includes internal breakdown, which can result in hazardous incidents. Furthermore, rechargeable batteries are used in many different applications that are especially sensitive to damage, such as medical devices worn on and/or implanted in a person's body.

Early detection of such internal breakdown in a rechargeable battery, before it becomes severe enough to cause a battery failure and/or a hazard, may allow such failures and/or hazards to be mitigated or avoided.

BRIEF DESCRIPTION OF THE DRAWINGS

For a detailed description of example embodiments, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Controller" shall mean, alone or in combination, individual circuit components, an application specific integrated circuit (ASIC), a microcontroller with controlling software, a reduced-instruction-set computer (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

In relation to electrical devices, the terms "input" and "output" refer to electrical connections to the electrical devices, and shall not be read as verbs requiring action. For example, a controller may have a gate output and one or more sense inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
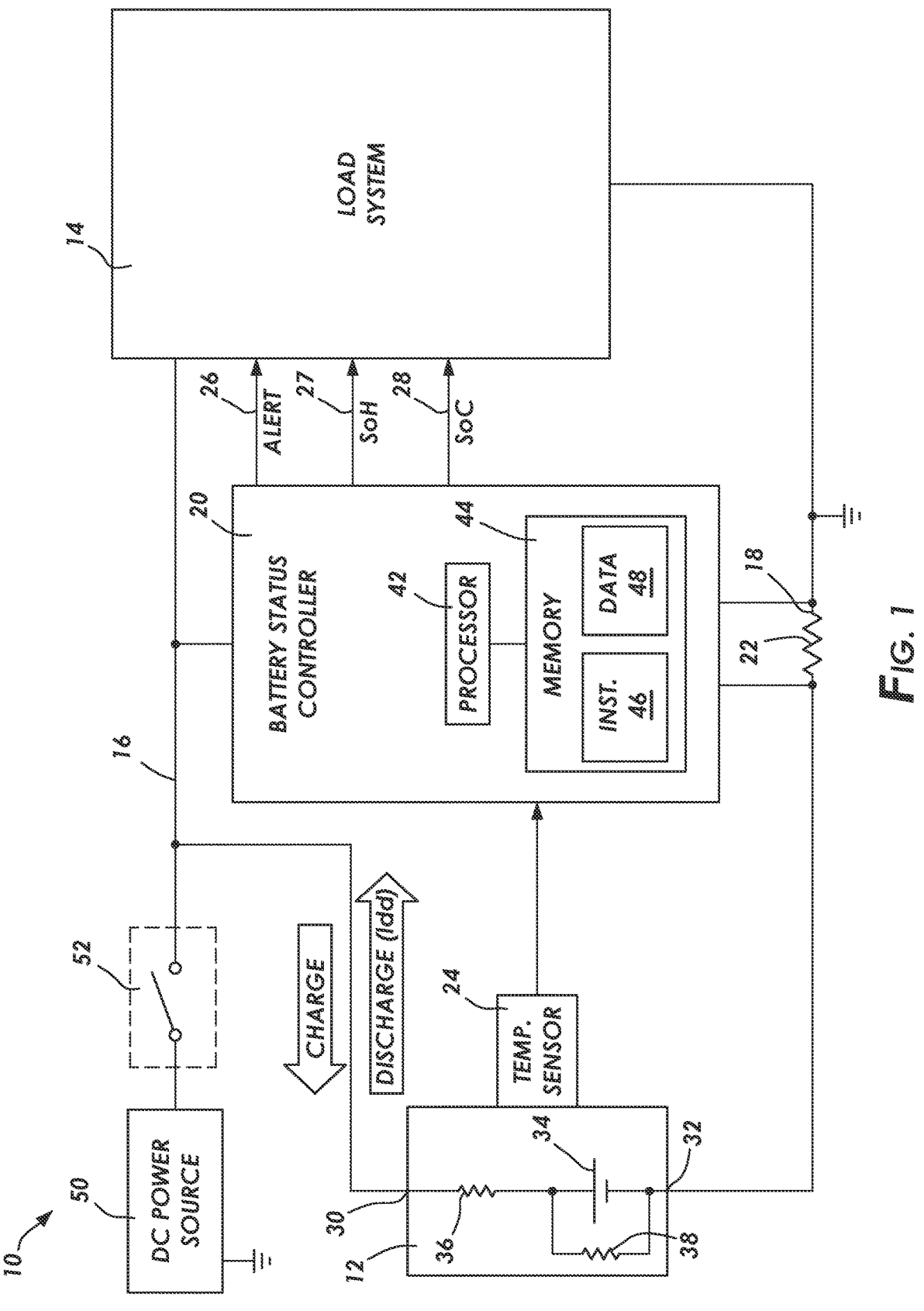
FIG. 1 shows schematic block diagram of a battery charging and monitoring system, in accordance with the present disclosure.

Example embodiments are directed to systems and methods for monitoring a status of a battery. The systems and methods of the present disclosure may provide for early detection of aged, damaged and/or degraded conditions in a battery, such as a lithium-ion battery, which may be indicative of an impending failure of the battery and/or a potential hazardous condition. FIG. 1 shows schematic block diagram of a battery charging and monitoring system 10. The system 10 includes a battery 12, and a load device 14 connected thereto via a first conductor 16 and a second conductor 18. The battery 12 includes one or more rechargeable battery cells. In some embodiments, the battery 12 may include lithium-ion battery cells. However, the systems and methods of the present disclosure may be used with other battery chemistries. The system 10 also includes a battery status controller 20 that is configured to monitor status of the battery 12. The battery status controller 20 is connected to each of the first conductor 16 and the second conductor 18 in order to measure a battery voltage $V_{batt}$ across the battery 12. The load device 14 may include, for example, a controller such as a microcontroller or system-on-chip device.

In some embodiments, the load device 14 may include a controller in a medical device, such as a portable medical device. In some embodiments, the system 10 may be included in a medical device, which may include one or more sensors and/or actuators to dispense a medication or to provide other medical treatment, such as an electrical stimulation for a particular medical purpose. For example, the system 10 may be included in a blood glucose sensor and/or an insulin pump for use by a diabetic patient. Additionally or alternatively, the system 10 may be included in a pacemaker or an implantable cardioverter-defibrillator (ICD) device for monitoring and treatment of a heart condition. However, the system 10 of the present disclosure may be used in a variety of different devices and applications.

A current sensor 22 is configured to measure a battery current $i_{dd}$ in the second conductor 18. The current sensor 22 is shown as a shunt resistor, which may have a very low resistance, such as a few milliohms mΩ. The battery status controller 20 is connected to the second conductor 18 on either of two sides of the current sensor 22 to measure a voltage thereacross, and to thereby measure the battery current. However, the current sensor 22 may use a different configuration, such as a non-contact inductive sensor. Alternatively or additionally, the current sensor 22 may be located elsewhere in the circuit with the battery 12, such as in the first conductor 16.

In some embodiments, and as shown in FIG. 1, the second conductor 18 may be connected to a ground plane, such as a chassis ground. The current sensor 22 is connected between the negative terminal 32 of the battery 12 and the connection to the ground plane in order to accurately and completely measure the battery current $i_{dd}$.

A temperature sensor 24 is thermally coupled to the battery 12 to measure a temperature of the battery 12. The battery status controller 20 is connected to the temperature sensor 24 for monitoring the temperature of the battery 12.

The battery 12 includes a positive terminal 30 connected to the first conductor 16 and a negative terminal 32 that is connected to the second conductor 18. The battery 12, as shown in FIG. 1, also includes model features 34, 36, 38 that represent real-world characteristics of the battery. As shown, the battery 12 includes an electrochemical cell 34 connected in series with an internal resistance 36. A self-discharge resistance 38, which may also be called a self-leak resistance, is connected in parallel with the electrochemical cell 34. The parallel combination of the self-discharge resistance 38 and the electrochemical cell 34 are connected in series with the internal resistance 36 between the positive terminal 30 and the negative terminal 32 of the battery 12. The combination of the internal resistance 36 and the self-discharge resistance 38 may represent all resistive effects of the battery 12, with the electrochemical cell 34 representing an idealized model, without resistance.

The internal resistance 36 may account for a majority of energy loss in the battery 12 during charging and discharging, when the battery current $i_{dd}$ has a non-zero value. The self-discharge resistance 38 may have a relatively small effect on energy loss in the battery 12 during charging and discharging. However, the self-discharge resistance 38 may decrease so as to have a larger effect on energy loss as the battery 12 is aged or otherwise damaged and/or degraded. In some cases, the self-discharge resistance 38 can reach a value that causes a hazard, such as a thermal runaway condition in the battery 12.

In some embodiments, and as shown in FIG. 1, the battery status controller 20 provides a plurality of status signals 26, 27, 28 to the load device 14. The status signals 26, 27, 28 may include a battery alert signal 26 to warn of a hazardous condition in the battery 12. The status signals 26, 27, 28 may include a state-of-health (SoH) signal 27 indicating a state of health of the battery 12. The status signals 26, 27, 28 may also include a state-of-charge (SoC) signal 28 indicating a state of charge of the battery 12. The status signals 26, 27, 28 may be generated and transmitted by the battery status controller 20 as individual signals, which may be communicated as discrete or analog voltage or current signals. Additionally or alternatively, one or more of the status signals 26, 27, 28 may be communicated using digital signals on a digital communications interface, such as a serial peripheral interface (SPI), an Inter-Integrated Circuit (I2C) interface, a Controller Area Network (CAN bus) interface, etc.

The battery status controller 20 includes a processor 42 coupled to a storage memory 44. The storage memory 44 stores instructions, such as program code for execution by the processor 42, in an instruction storage 46. The storage memory 44 also includes data storage 48 for holding data to be used by the processor 42. The data storage 48 may record, for example, values of the battery voltage $V_{batt}$, the battery current $i_{dd}$, and/or results of functions calculated by the processor 42.

FIG. 1 also shows a DC power source 50, which may be called a charging power source, and a charging switch 52 configured to selectively conduct current from the DC power source 50 to the first conductor 16 for charging the battery 12.

Figure 2:
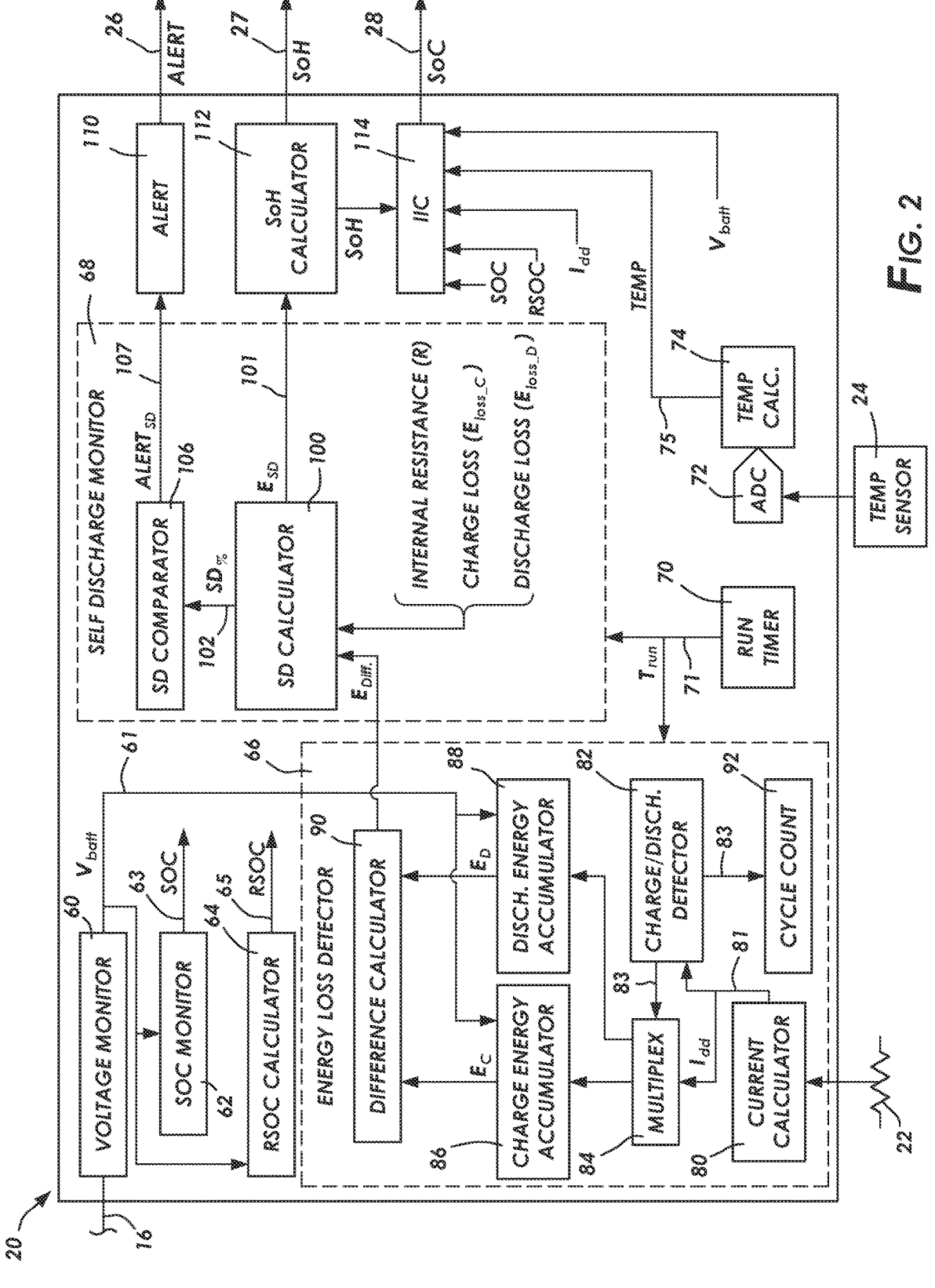
FIG. 2 shows a schematic block diagram of a battery status controller.

FIG. 2 shows a schematic block diagram of the battery status controller 20. As shown, the battery status controller 20 includes a voltage monitor 60 that is connected to the first conductor 16 and configured to generate a signal 61 representing the battery voltage $V_{batt}$. The battery status controller 20 also includes a SOC calculator 62 that is configured to generate a SOC signal 63 representing a state of charge (SOC) of the battery 12 based on the battery voltage $V_{batt}$. The SOC signal 63 may indicate an absolute state of charge the battery 12 as an amount of charge or energy stored in the battery 12. The battery status controller 20 also includes an RSOC calculator 64 that is configured to generate an RSOC signal 65 representing a relative state of charge (RSOC) of the battery 12 based on the battery voltage $V_{batt}$. The RSOC signal 65 may indicate a state of charge the battery 12 as a fraction of a full charge or predetermined capacity of charge. The battery status controller 20 also includes an energy loss detector 66 that is configured to determine a total energy loss in the battery 12 through a plurality of charge cycles and a plurality of discharge cycles and based on the battery voltage $V_{batt}$ and the battery current $i_{dd}$. The battery status controller 20 also includes a self-discharge monitor 68 that is configured to generate a self-discharge energy signal 101 representing a self-discharge energy $E_{SD}$, and which corresponds to energy loss in the battery 12 due to the self-discharge resistance 38. The battery status controller 20 also includes a run timer 70 that provides a running time signal 71 representing an amount of time $T_{run}$ elapsed during each of the plurality of charge cycles and the plurality of discharge cycles.

The battery status controller 20 also includes an analog-to-digital converter (ADC) 72 and a temperature calculator 74. The ADC 72 is coupled to the temperature sensor 24 and configured to generate a raw signal representing the temperature measured by the temperature sensor 24 and to supply that raw signal to the temperature calculator 74. The temperature calculator 74 is configured to generate a temperature signal 75 representing the temperature (Temp) of the battery 12, as measured by the temperature sensor 24. For example, the temperature calculator 74 may compute the temperature signal 75 by applying a scale factor and/or an offset to the raw signal from the ADC 72.

As shown in FIG. 2, the energy loss detector 66 includes a current calculator 80 that is connected to the current sensor 22 and configured to determine the battery current $i_{dd}$. For example, the current calculator 80 may determine a voltage differential across the current sensor 22 and then compute the battery current $i_{dd}$ by applying a scale factor and/or an offset to the voltage differential across the current sensor 22.

The energy loss detector 66 also includes a charge/discharge detector 82 that receives a signal 81 from the current calculator 80 representing the battery current $i_{dd}$. The charge/discharge detector 82 produces a charging status signal 83 indicating a charging status of the battery 12 based on a value of the battery current $i_{dd}$. The charging status signal 83 may include Boolean value having one logic level indicating the battery 12 being charged, and a different logic level indicating the battery 12 not being charged. For example, the charge/discharge detector 82 may drive the charging status signal 83 to a high logic level in response to the battery current $i_{dd}$ being below a first threshold current indicative of the battery 12 being charged. The charge/discharge detector 82 may drive the charging status signal 83 to a low logic level in response to the battery current $i_{dd}$ being above a second threshold current indicative of the battery 12 no longer being charged.

The energy loss detector 66 also includes a multiplexer 84, a charge energy accumulator 86, and a discharge energy accumulator 88. The multiplexer 84 receives a signal from the current calculator 80 representing the battery current $i_{dd}$. The multiplexer 84 provides the signal representing the battery current $i_{dd}$ to only one of the charge energy accumulator 86 or the discharge energy accumulator 88, based on the charging status signal 83. For example, when the charging status signal 83 indicates the battery 12 being charged, the multiplexer 84 may provide the signal representing the battery current $i_{dd}$ to the charge energy accumulator 86, and a different signal, such as a zero or null signal, to the discharge energy accumulator 88. When the charging status signal 83 indicates the battery 12 not being charged, the multiplexer 84 may provide the signal representing the battery current $i_{dd}$ to the discharge energy accumulator 88, and a different signal, such as a zero or null signal, to the charge energy accumulator 86.

The energy loss detector 66 also includes a cycle counter 92 that receives the charging status signal 83 and which is configured to keep a count of a number of the charge cycles and/or the number of the discharge cycles. In some embodiments, energy loss detector 66 may only provide the data regarding the total energy loss in the battery after a predetermined number of charge cycles and/or discharge cycles have taken place. Additionally or alternatively, the cycle counter 92 may be configured to determine when an equal number of charge cycles and discharge cycles have transpired, and the energy loss detector 66 may update the difference energy signal $E_{Diff}$ only when the number of charge cycles and discharge cycles are equal.

The charge energy accumulator 86 is configured to generate an accumulated charging energy signal $E_C$ representing an amount of energy supplied to the battery 12 over a plurality of charge cycles. The charge energy accumulator 86 uses, for generating the charging energy signal $E_C$, the signal from the voltage monitor 60 representing the battery voltage $V_{batt}$, and the signal from the multiplexer 84 representing the battery current $i_{dd}$ while the battery 12 is being charged. In some embodiments, the charge energy accumulator 86 may also use the running time signal $T_{run}$ from the run timer 70 for generating the charging energy signal $E_C$.

The discharge energy accumulator 88 is configured to generate an accumulated discharge energy signal $E_D$ representing an amount of energy discharged from the battery 12 over a plurality of discharge cycles. The discharge energy accumulator 88 uses, for generating the discharge energy signal $E_D$, the signal from the voltage monitor 60 representing the battery voltage $V_{batt}$, and the signal from the multiplexer 84 representing the battery current $i_{dd}$ while the battery 12 is not being charged. In some embodiments, the discharge energy accumulator 88 may also use the running time signal $T_{run}$ from the run timer 70 for generating the discharge energy signal $E_D$.

The energy loss detector 66 also includes a difference calculator 90 configured to compute a difference energy signal $E_{Diff}$, and which represents a total energy loss in the battery 12 through the plurality of charge cycles and the plurality of discharge cycles. For example, the energy loss detector 66 may determine the difference energy signal $E_{Diff}$ by subtracting the discharge energy signal $E_D$ from the charging energy signal $E_C$. The difference energy signal $E_{Diff}$ may represent a combination of energy losses attributable to the internal resistance 36 and the self-discharge resistance 38. A portion of the difference energy signal $E_{Diff}$ may represent a difference in available energy in the battery 12 due to differences in state-of-charge. However, this portion may be low or zero where there is no difference in available energy in the battery 12, such as where the number of charge cycles is equal to the number of discharge cycles. Additionally, and for a sufficiently long period of evaluation, such as over several hundred charge cycles and several hundred discharge cycles, the portion of the difference energy signal $E_{Diff}$ representing the difference in available energy in the battery 12 may be negligible compared to the energy losses attributable to the internal resistance 36 and the self-discharge resistance 38.

As shown in FIG. 2, the battery status controller 20 also includes an alert generator 110 configured to generate the battery alert signal 26 based on a self-discharge alert signal 107 from the self-discharge monitor 68. The battery status controller 20 also includes a SoH calculator 112 configured to generate the SoH signal 27 based on a self-discharge energy signal $E_{SD}$ from the self-discharge monitor 68. For example, the SoH calculator 112 may determine an initial SoH estimate using a number of charge and discharge cycles, the charging energy loss $E_{loss\_C}$, and/or the discharging energy loss $E_{loss\_D}$. The SoH calculator 112 may adjust the initial SoH estimate to generate the SoH signal 27 based on the self-discharge energy signal $E_{SD}$ from the self-discharge monitor 68. Accordingly, the SoH calculator 112 of the present disclosure may provide an improved estimate of the state-of-health, when compared to conventional devices.

The initial SoH estimate may include an SoH value (SOH) that may be determined as set forth in equation (1):

$$SOH = \frac{Q_{max}}{Q_0} \times 100\% \tag{1}$$

where $Q_0$ is a rated capacity of the battery 12 (which may also be called a nominal charge capacity), and where $Q_{max}$ is a maximum charge capacity of the battery 12 in its current condition.

The SoH calculator 112 of the present disclosure may generate the SoH signal 27 representing a refined SOH value that accounts for the self-discharge losses in the battery 12, and which may be determined in accordance with equation (2):

$$SOH = \frac{Q_{max} - \text{self discharge loss capacity}}{Q_0} \times 100\% \tag{2}$$

The self discharge loss capacity represents a reduction in charge storage capacity of the battery due to the self-discharge resistance 38. The SoH calculator 112 may compute or otherwise determine the self discharge loss capacity based on the self-discharge energy signal $E_{SD}$ from the self-discharge monitor 68.

The battery status controller 20 also includes an initial inventory charge controller (IIC) 114 configured to generate the SoC signal 28 based on several signals pertaining to the battery 12, such as the battery voltage $V_{batt}$, the battery current $i_{dd}$, the SOC signal 63 from the SOC calculator 62, the RSOC signal 65 from the RSOC calculator 64, and the temperature signal 75 from the temperature calculator 74.

An initial RSOC estimate may be determined as set forth in equation (3):

$$RSOC = \frac{Q_{charge}}{Q_{max}} \times 100\% \tag{3}$$

where $Q_{charge}$ is an amount of charge stored in the battery 12, in its current condition. The IIC 114 may generate the SoC signal 28 representing a refined RSOC value that accounts for the self-discharge losses in the battery 12, and which may be determined in accordance with equation (4):

$$RSOC = \frac{Q_{charge}}{Q_{max} - \text{self discharge loss capacity}} \times 100\% \quad (4)$$

The self-discharge monitor 68 is configured to generate one or more signals indicative of the self-discharge resistance 38 of the battery 12. The self-discharge monitor 68 includes a self-discharge calculator 100 that is configured to calculate the self-discharge energy $E_{SD}$. The self-discharge calculator 100 is also configured to calculate a self-discharge loss percentage (SD %) representing energy loss due to the self-discharge resistance 38, as a percentage of a total energy supplied to the battery 12.

The self-discharge calculator 100 may take, as inputs, an internal resistance value R representing the internal resistance 36 of the battery 12, a charging energy loss $E_{loss\_C}$, and a discharging energy loss $E_{loss\_D}$. The charging energy loss $E_{loss\_C}$, represents an energy loss in the battery 12 due to the internal resistance 36 of the battery 12, and throughout a plurality of charge cycles during which the battery status controller 20 is active, and the discharging energy loss $E_{loss\_D}$ represents an energy loss in the battery 12 due to the internal resistance 36 of the battery 12, and throughout a plurality of discharge cycles during which the battery status controller 20 is active. The internal resistance value R may be determined based on the battery voltage $V_{batt}$ and how it changes as a function of the battery current $i_{dd}$ during charging and/or discharging. The charging energy loss $E_{loss\_C}$, and the discharging energy loss $E_{loss\_D}$ may each be determined based on the battery voltage $V_{batt}$, the battery current $i_{dd}$, and the internal resistance value R, over a period of time. For example, the charging energy loss $E_{loss\_C}$, and the discharging energy loss $E_{loss\_D}$ may each be determined over the same plurality of charge cycles and discharge cycles charge used by the a difference calculator 90 to compute the difference energy signal $E_{Diff}$.

The self-discharge calculator 100 may determine an internal energy loss $E_{loss\_CD}$ in the battery 12 due to the internal resistance 36, as a sum of the charging energy loss $E_{loss\_C}$, and the discharging energy loss $E_{loss\_D}$. The self-discharge monitor 68 may calculate the self-discharge energy $E_{SD}$ by subtracting the internal energy loss $E_{loss\_CD}$ from the difference energy $E_{Diff}$, which represents the total energy loss in the battery 12 through the plurality of charge cycles and the plurality of discharge cycles.

The self-discharge monitor 68 also calculates self-discharge ratio between the self-discharge energy $E_{SD}$ and a total energy $E_{total}$ supplied to the battery 12. The total energy $E_{total}$ may represent a combination of energy stored in the battery 12 and energy losses attributable to the internal resistance 36 and the self-discharge resistance 38. The self-discharge monitor 68 may compute or otherwise determine the total energy supplied to the battery 12 based on the battery voltage $V_{batt}$ and the battery current $i_{dd}$. In some embodiments, the total energy supplied to the battery 12 may be determined by a source outside of the self-discharge monitor 68, such as the initial inventory charge controller 114.

For example, the self-discharge monitor 68 may calculate the self-discharge ratio by dividing the self-discharge energy $E_{SD}$ by the total energy $E_{total}$. The self-discharge monitor 68 may provide a self-discharge percentage $SD_\%$ based on the self-discharge ratio multiplied by 100.

The self-discharge monitor 68 also includes a self-discharge comparator 106 that is configured to compare the self-discharge percentage $SD_\%$ with a self-discharge threshold value and to generate the self-discharge alert signal 107 representing a high self-discharge condition $Alert_{SD}$ in the battery 12, and in response to determining the self-discharge percentage $SD_\%$ exceeding the self-discharge threshold value. For example, the self-discharge comparator 106 may generate the self-discharge alert signal 107 in response to determining the self-discharge percentage $SD_\%$ exceeding a self-discharge threshold value of 1.0%. The self-discharge threshold may have a different value, which may depend, for example, on an intended application or details of the construction or chemistry of the battery 12. For example, a lower self-discharge threshold value may be used for a battery in a safety-critical application, such as an implanted medical device, compared to other applications with lower safety requirements.

Figure 3:
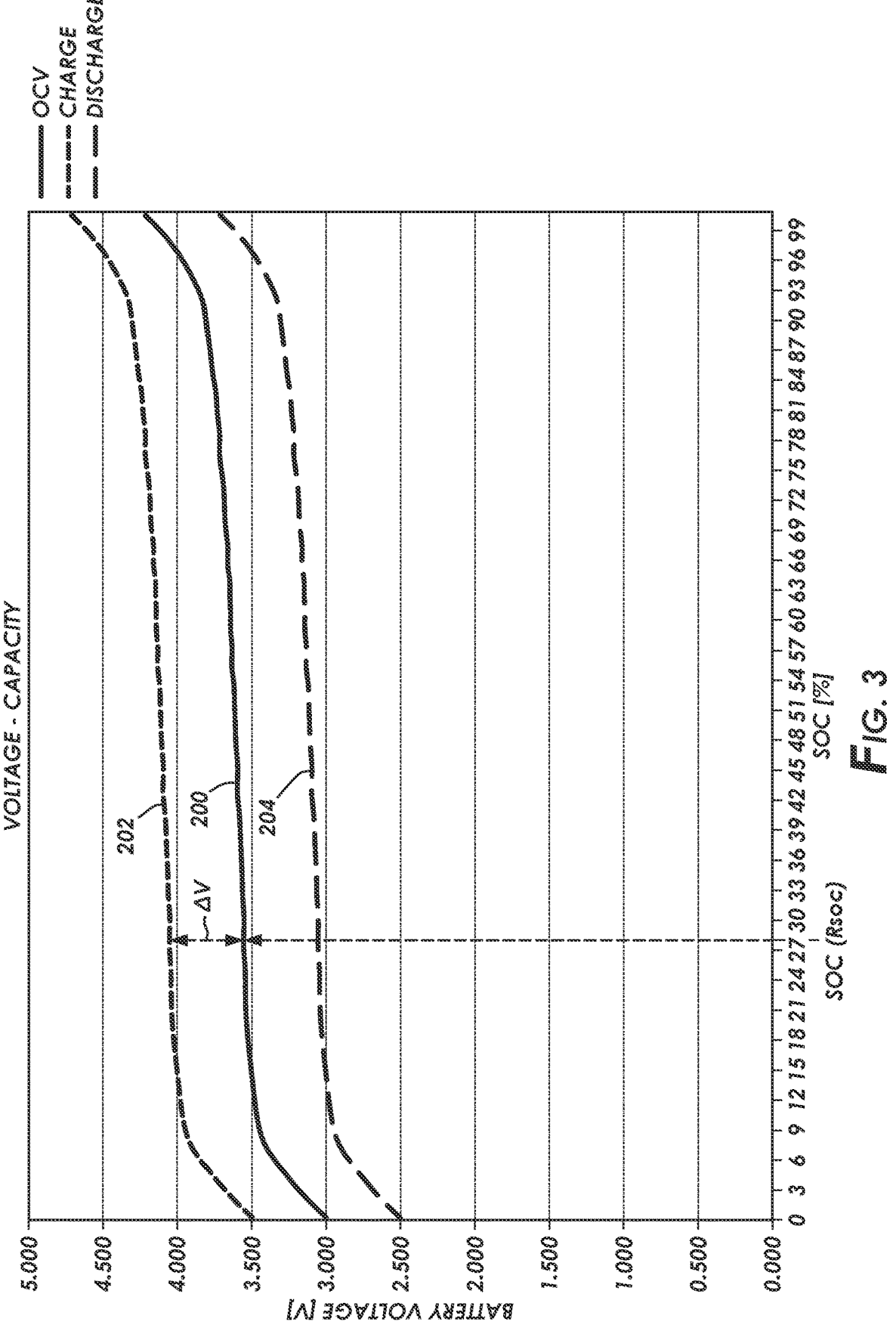
FIG. 3 shows a graph with plots representing battery voltage as a function of state of charge (SOC) for open-circuit, charging, and discharging conditions.

FIG. 3 shows a graph with plots 200, 202, 204 representing battery voltage as a function of state of charge (SOC) for open-circuit, charging, and discharging conditions, respectively. FIG. 3 includes a first plot 200 representing battery voltage as a function of state of charge (SOC) for the battery 12 in an open-circuit condition, with the battery current $i_{dd}$ substantially equal to zero. FIG. 3 also includes a second plot 202 representing battery voltage as a function of state of charge (SOC) for the battery 12 in a charging condition, and a third plot 204 representing battery voltage as a function of state of charge (SOC) for the battery 12 in a discharging condition.

With reference to FIG. 3, the first plot 200, representing open-circuit voltage condition may be unaffected by temperature or by battery aging, while the internal resistance 36 will be influenced by temperature and/or by battery aging, (the internal resistance 36 will increase with higher temperature or aging). Thus, the second plot 202 and the third plot 204 will each be influenced by temperature and/or by battery aging, even with a same battery current $i_{dd}$. Accordingly, the total energy loss in the battery through the plurality of charge cycles and the plurality of discharge cycles (block 302) may be determined based on the battery voltage $V_{batt}$ in combination with one of the SOC signal 63 and/or the RSOC signal 65, which may be designated as SOC/RSOC.

Thus, determining the energy loss during charging and/or discharging may include: determining the SOC/RSOC; determining the open-circuit voltage at the SOC/RSOC; determining a voltage differential $\Delta V$ by subtracting the open-circuit voltage at the SOC/RSOC from a measured value of the battery voltage $V_{batt}$; and computing the energy loss $E_{loss}$ (which may include the charging energy loss $E_{loss\_C}$, and/or the discharging energy loss $E_{loss\_D}$) in accordance with equation (5):

$$E_{loss} = \Delta V \times I_{dd} \times \text{time} \quad (5)$$

This methodology for determining the energy loss during charging and/or discharging may include updating the SOC/RSOC as it increases or decreases over time.

Figure 4:
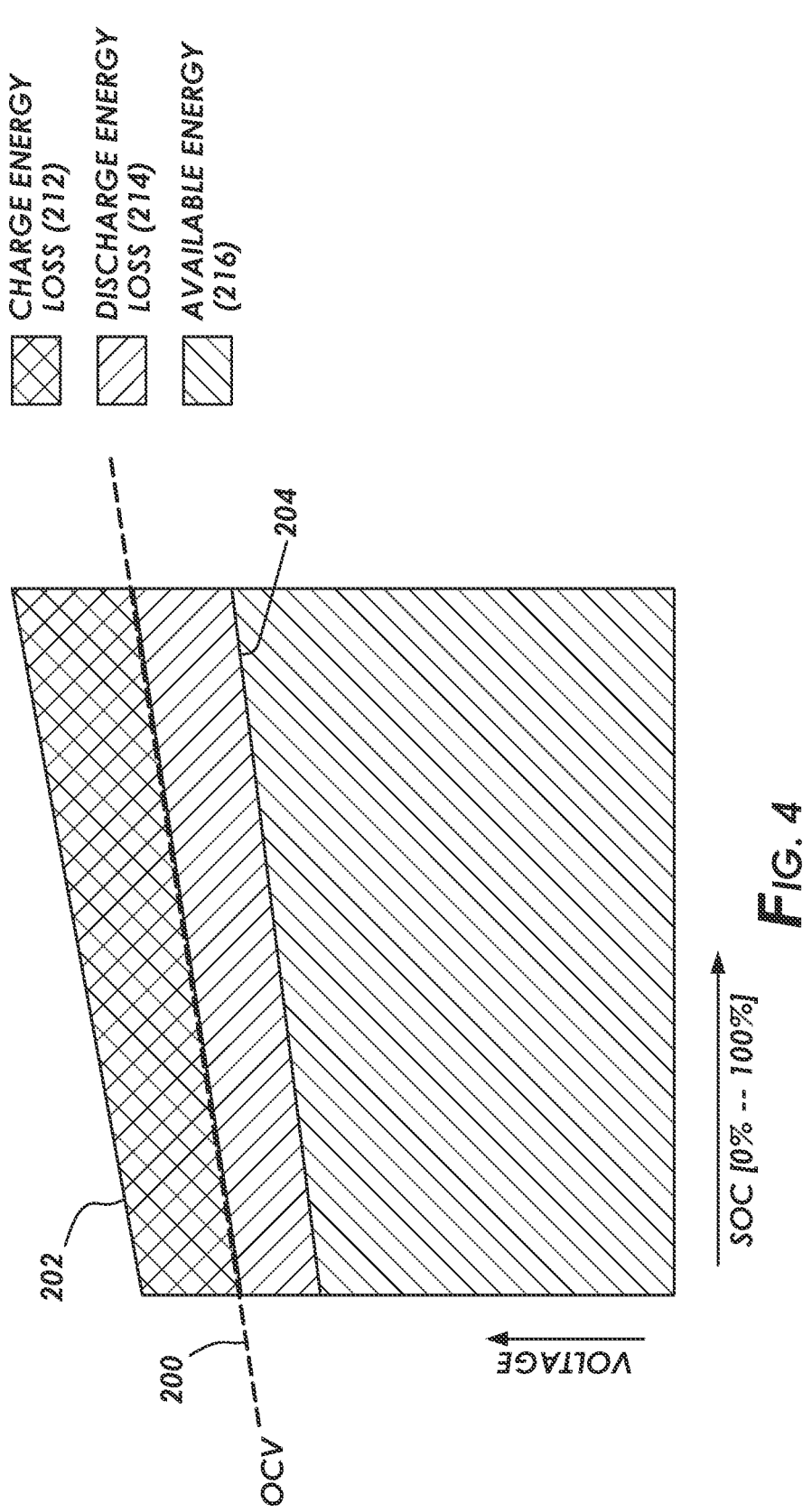
FIG. 4 shows a graph illustrating charging and discharging energy losses and available energy, as a function of SOC.

FIG. 4 shows a graph illustrating charging and discharging energy losses and available energy, as a function of SOC. The graph of FIG. 4 includes the plots 200, 202, 204 representing battery voltage as a function of state of charge (SOC) for open-circuit, charging, and discharging conditions, respectively. FIG. 4 shows a first region 212 between the first plot 200 and the second plot 202 and representing the charging energy loss $E_{loss\_C}$ due to the internal resistance 36 with the battery 12 being charged. FIG. 4 also shows a second region 214 between the first plot 200 and the third plot 204 and representing the discharging energy loss $E_{loss\_D}$ due to the internal resistance 36 with the battery 12 being discharged. FIG. 4 also shows a third region 216 below the third plot 204 and representing an estimate of available energy in the battery 12. This estimate of available energy represented by the third region 216 does not account for any energy loss due to the self-discharge resistance 38.

Figure 5:
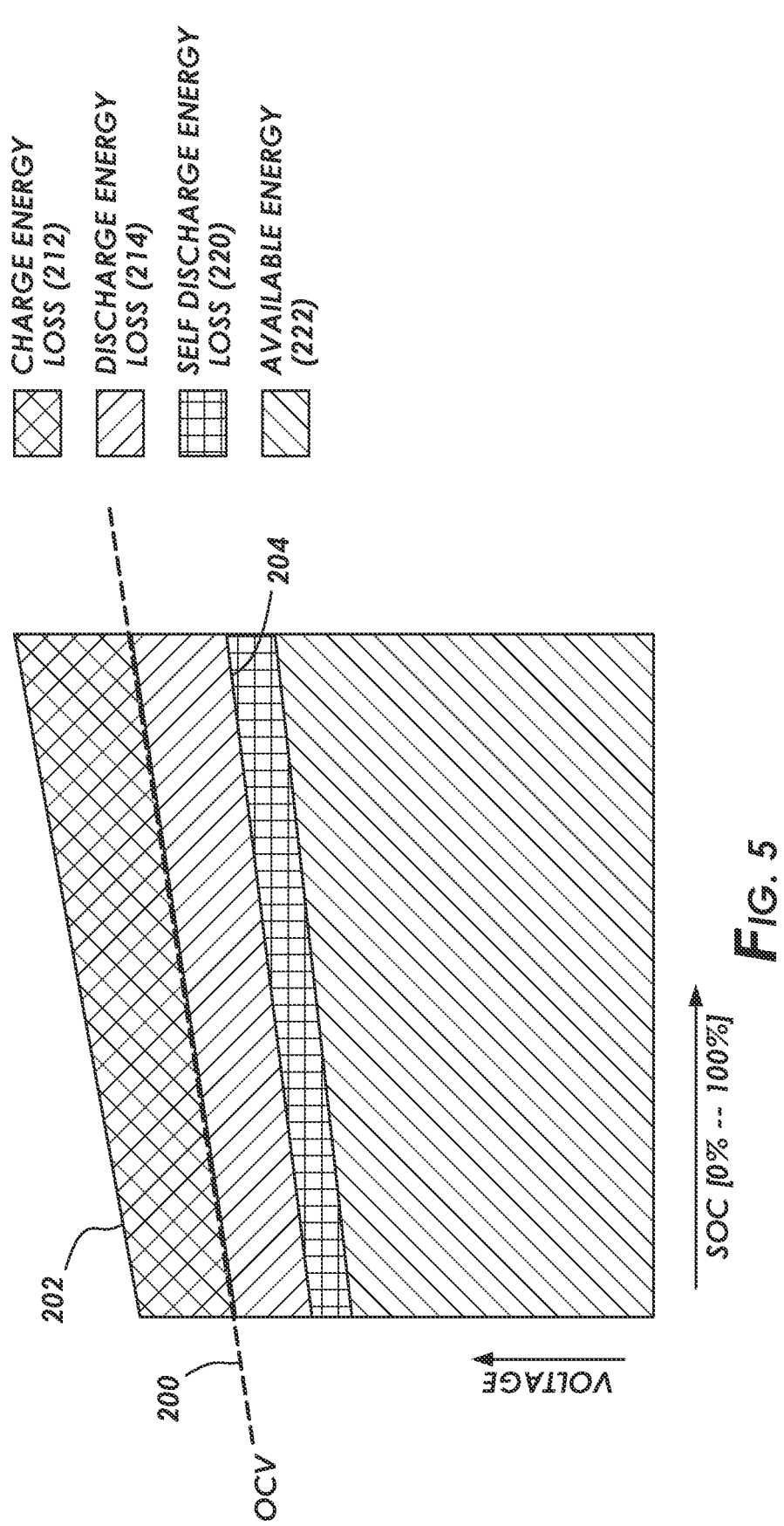
FIG. 5 shows a graph illustrating charging, discharging, and self-discharge energy losses, and available energy, as a function of SOC.

FIG. 5 shows another graph illustrating charging, discharging, and self-discharge energy losses, and available energy, as a function of SOC. The graph of FIG. 5 is similar to the graph of FIG. 4, including the plots 200, 202, 204. However, FIG. 5 also includes a fourth region 220 directly below the third plot 204, and which represents the energy loss due to the self-discharge resistance 38. FIG. 5 also includes a fifth region 222 below the fourth region 220, and which represents an improved estimate of available energy in the battery 12, which accounts for the energy loss due to the self-discharge resistance 38. This improved estimate of available energy in the battery 12 represented by the fifth region 222 is determined in accordance with the present disclosure and may provide a more accurate estimate of the available energy in the battery 12, when compared to an alternative estimate, such as the estimate represented by the third region 216 shown in FIG. 4.

Figure 6:
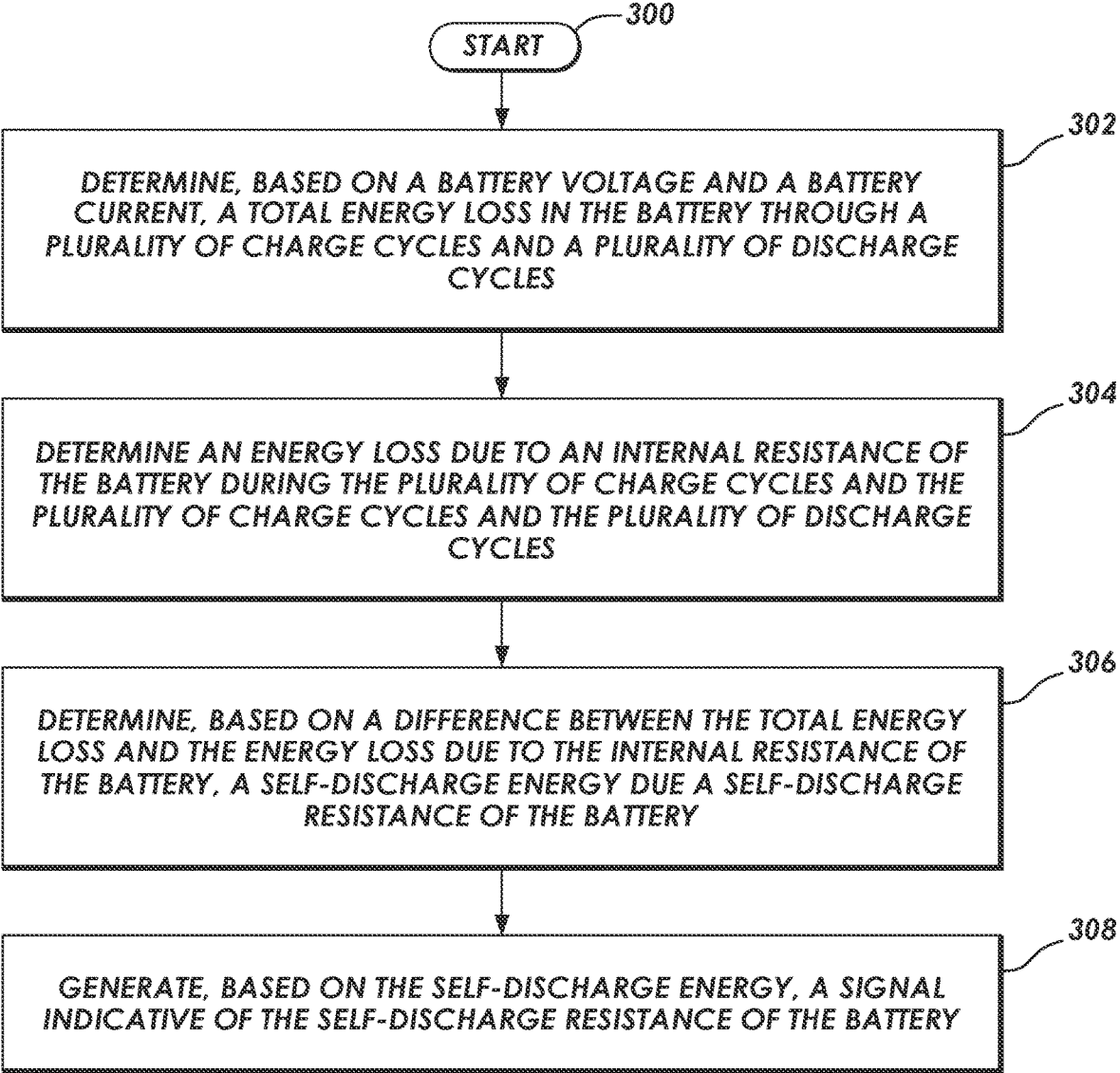
FIG. 6 shows a flow chart listing method steps in accordance with at least some embodiments.

FIG. 6 shows a flow chart listing steps in a method for monitoring a status of a battery, and accordance with at least some embodiments. In particular, the method starts (block 300) and comprises: determining, based on a battery voltage and a battery current, a total energy loss in the battery through a plurality of charge cycles and a plurality of discharge cycles (block 302). For example, the processor 42 may execute instructions to implement the energy loss detector 66 and to thereby determine the total energy loss in the battery 12 through the plurality of charge cycles and discharge cycles.

The method also includes determining an energy loss due to an internal resistance of the battery during the plurality of charge cycles and the plurality of discharge cycles (block 304). For example, the processor 42 may execute instructions to implement the self-discharge calculator 100 and to calculate the internal energy loss $E_{loss\_CD}$ in the battery 12 due to the internal resistance 36, as a sum of the charging energy loss $E_{loss\_C}$, and the discharging energy loss $E_{loss\_D}$.

The method also includes determining, based on a difference between the total energy loss and the energy loss due to the internal resistance of the battery, a self-discharge energy due to a self-discharge resistance of the battery (block 306). For example, the processor 42 may execute instructions to implement the self-discharge calculator 100 to calculate the self-discharge energy $E_{SD}$ by subtracting the internal energy loss $E_{loss\_CD}$ from the difference energy $E_{Diff}$.

The method also includes generating, based on the self-discharge energy, a signal indicative of the self-discharge resistance of the battery (block 308). For example, the processor 42 may execute instructions to implement the self-discharge calculator 100 to generate signals 101, 102 representing the self-discharge energy $E_{SD}$ and the self-discharge percentage $SD_\%$, respectively.

In some embodiments, the method may further include generating a state-of-health signal representing a state of health of the battery. In some embodiments, the step of generating the signal indicative of the self-discharge resistance of the battery (block 308) includes adjusting the state-of-health signal based on the self-discharge energy. For example, the processor 42 may execute instructions to implement the SoH calculator 112 to generate the SoH signal 27 based on the self-discharge energy signal $E_{SD}$ from the self-discharge monitor 68.

In some embodiments, the method may further include generating a state-of-charge signal representing a state of charge of the battery. In some embodiments, the step of generating the signal indicative of the self-discharge resistance of the battery (block 308) includes adjusting the state-of-charge signal based on the self-discharge energy. For example, the processor 42 may execute instructions to implement the IIC 114 to generate the SoC signal 28 in accordance with equation (4) and to represent the refined RSOC value that accounts for the self-discharge losses in the battery 12. Alternatively or additionally, the processor 42 may execute instructions to implement the IIC 114 to adjust the SOC signal 63 based on the self discharge loss capacity and to thereby generate the SoC signal 28 representing an adjusted absolute SOC that accounts for the self-discharge energy $E_{SD}$.

In some embodiments, the signal indicative of the self-discharge resistance of the battery includes an alert signal indicating the battery having a deteriorated condition. For example, the processor 42 may execute instructions to implement the alert generator 110 to generate the battery alert signal 26 based on the self-discharge alert signal 107 from the self-discharge monitor 68.

In some embodiments, the method may further include: determining, based on the self-discharge energy, a self-discharge metric; and determining the self-discharge metric exceeding a threshold value. In some embodiments, the step of generating the signal indicative of the self-discharge resistance of the battery (block 308) includes generating the alert signal based on the self-discharge metric exceeding the threshold value. For example, the processor 42 may execute instructions to implement the self-discharge comparator 106 to compare the self-discharge percentage $SD_\%$ with the self-discharge threshold value and to generate self-discharge alert signal $Alert_{SD}$ in response to determining the self-discharge percentage $SD_\%$ exceeding the self-discharge threshold value.

In some embodiments, the method may further include: determining a total energy supplied to the battery; and calculating a self-discharge ratio between the self-discharge energy and the total energy supplied to the battery. In some embodiments, the self-discharge metric includes the self-discharge ratio. For example, the processor 42 may execute instructions to implement the self-discharge calculator 100 to calculate the self-discharge loss percentage $(SD_\%)$ representing energy loss due to the self-discharge resistance 38, as a percentage of a total energy supplied to the battery 12.

In some embodiments, the method may further include measuring, using a current sensor, a measured battery current. In some embodiments, the step of determining the total energy loss in the battery through the plurality of charge cycles and the plurality of discharge cycles (block 302) includes determining the total energy loss in the battery based on the battery voltage and the measured battery current. For example, the processor 42 may execute instructions to implement the current calculator 80 to determine the battery current $i_{dd}$ based on a voltage differential across the current sensor 22.

In some embodiments, the method may further include determining, based on the battery voltage, an estimated battery current. In some embodiments, the step of determining the total energy loss in the battery through the plurality of charge cycles and the plurality of discharge cycles (block 302) includes determining the total energy loss in the battery based on the battery voltage and the estimated battery current. For example, the processor 42 may execute instructions to compute an estimated value of the battery current $i_{dd}$ based on the battery voltage $V_{batt}$ and either or both of the SOC signal 63 and/or the RSOC signal 65.

In some embodiments, the method may further include measuring a temperature of the battery. In some embodiments, the step of determining the estimated battery current includes determining the estimated battery current based on the battery voltage and based on the temperature of the battery. For example, the processor 42 may execute instructions to further refine the estimated value of the battery current $i_{dd}$ based on the temperature signal 75 from the temperature calculator 74.

In some embodiments, the self-discharge resistance of the battery may be determined while the battery is connected to a load system and remains connected to the load system throughout the plurality of charge cycles and the plurality of discharge cycles. For example, the systems and methods of the present disclosure provide for measuring the self-discharge resistance of the battery, without disconnecting the battery from its load. This is different from conventional techniques, which may require the battery to be disconnected from any external load in order to measure the self-discharge resistance. The systems and methods of the present disclosure may be especially advantageous for numerous applications, such as medical devices, where the battery is required to remain connected to the load at all times.

The systems and methods of the present disclosure detect increases in self-discharge resistance, which may be indicative of an abnormal condition within the battery, and which may provide an early warning of cell failure and/or a potential hazardous condition in the battery. Thus, the systems and methods of the present disclosure may avoid or mitigate such potential hazards by removing, replacing, or otherwise adjusting use of the battery.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for monitoring a status of a battery, the method comprising:

determining, based on a battery voltage and a battery current, a total energy loss in the battery through a plurality of charge cycles and a plurality of discharge cycles;

determining an energy loss due to an internal resistance of the battery during the plurality of charge cycles and the plurality of discharge cycles;

determining, based on a difference between the total energy loss and the energy loss due to the internal resistance of the battery, a self-discharge energy due to a self-discharge resistance of the battery;

generating, based on the self-discharge energy, a signal indicative of the self-discharge resistance of the battery; and generating at least one of: a state-of-health signal representing a state of health of the battery, or a state-of-charge signal representing a state of charge of the battery, wherein generating the signal indicative of the self-discharge resistance of the battery includes adjusting, based on the self-discharge energy, the at least one of: the state-of-health signal, or the state-of-charge signal.

2. The method of claim 1, wherein generating the at least one of: the state-of-health signal, or the state-of-charge signal includes generating the state-of-health signal representing the state of health of the battery, wherein generating the signal indicative of the self-discharge resistance of the battery includes adjusting the state-of-health signal based on the self-discharge energy.

3. The method of claim 1, wherein generating the at least one of: the state-of-health signal, or the state-of-charge signal includes generating the state-of-charge signal representing the state of charge of the battery, wherein generating the signal indicative of the self-discharge resistance of the battery includes adjusting the state-of-charge signal based on the self-discharge energy.

4. The method of claim 1, wherein the signal indicative of the self-discharge resistance of the battery includes an alert signal indicating the battery having a deteriorated condition.

5. The method of claim 4, further comprising:

determining, based on the self-discharge energy, a self-discharge metric; and determining the self-discharge metric exceeding a threshold value, wherein generating the signal indicative of the self-discharge resistance of the battery includes generating the alert signal based on the self-discharge metric exceeding the threshold value.

6. The method of claim 1, further comprising measuring, using a current sensor, a measured battery current, wherein determining the total energy loss in the battery through the plurality of charge cycles and the plurality of discharge cycles includes determining the total energy loss in the battery based on the battery voltage and the measured battery current.

7. The method of claim 1, further comprising determining, based on the battery voltage, an estimated battery current, wherein determining the total energy loss in the battery through the plurality of charge cycles and the plurality of discharge cycles includes determining the total energy loss in the battery based on the battery voltage and the estimated battery current.

8. The method of claim 7, further comprising measuring a temperature of the battery, wherein determining the estimated battery current includes determining the estimated battery current based on the battery voltage and based on the temperature of the battery.

9. The method of claim 1, wherein the battery is connected to a load system and remains connected to the load system throughout the plurality of charge cycles and the plurality of discharge cycles.

10. A method for monitoring a status of a battery, the method comprising:

determining, based on a battery voltage and a battery current, a total energy loss in the battery through a plurality of charge cycles and a plurality of discharge cycles;

determining an energy loss due to an internal resistance of the battery during the plurality of charge cycles and the plurality of discharge cycles;

determining, based on a difference between the total energy loss and the energy loss due to the internal resistance of the battery, a self-discharge energy due to a self-discharge resistance of the battery;

generating, based on the self-discharge energy, a signal indicative of the self-discharge resistance of the battery determining, based on the self-discharge energy, a self-discharge metric;

determining the self-discharge metric exceeding a threshold value;

determining a total energy supplied to the battery; and calculating a self-discharge ratio between the self-discharge energy and the total energy supplied to the battery, wherein the signal indicative of the self-discharge resistance of the battery includes an alert signal indicating the battery having a deteriorated condition, wherein generating the signal indicative of the self-discharge resistance of the battery includes generating the alert signal based on the self-discharge metric exceeding the threshold value, and wherein the self-discharge metric includes the self-discharge ratio.

11. A system for monitoring a status of a battery, the system comprising:

a controller configured to:

determine, based on a battery voltage and a battery current, a total energy loss in the battery through a plurality of charge cycles and a plurality of discharge cycles;

determine an energy loss due to an internal resistance of the battery during the plurality of charge cycles and the plurality of discharge cycles;

determine, based on a difference between the total energy loss and the energy loss due to the internal resistance of the battery, a self-discharge energy due to a self-discharge resistance of the battery;

generate, based on the self-discharge energy, a signal indicative of the self-discharge resistance of the battery; and generate at least one of: a state-of-health signal representing a state of health of the battery, or a state-of-charge signal representing a state of charge of the battery, wherein generating the signal indicative of the self-discharge resistance of the battery includes adjusting, based on the self-discharge energy, the at least one of: the state-of-health signal, or the state-of-charge signal.

12. The system of claim 11, wherein generating the at least one of: the state-of-health signal, or the state-of-charge signal includes generating the state-of-health signal representing the state of health of the battery, and wherein generating the signal indicative of the self-discharge resistance of the battery includes adjusting the state-of-health signal based on the self-discharge energy.

13. The system of claim 11, wherein generating the at least one of: the state-of-health signal, or the state-of-charge signal includes generating the state-of-charge signal representing the state of charge of the battery, and wherein generating the signal indicative of the self-discharge resistance of the battery includes adjusting the state-of-charge signal based on the self-discharge energy.

14. The system of claim 11, wherein the signal indicative of the self-discharge resistance of the battery includes an alert signal indicating the battery having a deteriorated condition.

15. The system of claim 14, wherein the controller is further configured to:

determine, based on the self-discharge energy, a self-discharge metric; and determine the self-discharge metric exceeding a threshold value, and wherein generating the signal indicative of the self-discharge resistance of the battery includes generating the alert signal based on the self-discharge metric exceeding the threshold value.

16. The system of claim 11, further comprising: a current sensor configured to measure a measured battery current, and wherein determining the total energy loss in the battery through the plurality of charge cycles and the plurality of discharge cycles includes determining the total energy loss in the battery based on the battery voltage and the measured battery current.

17. The system of claim 11, wherein the controller is further configured to determine, based on the battery voltage, an estimated battery current; and wherein determining the total energy loss in the battery through the plurality of charge cycles and the plurality of discharge cycles includes determining the total energy loss in the battery based on the battery voltage and the estimated battery current.

18. The system of claim 17, further comprising: a temperature sensor configured to measure a temperature of the battery, and wherein determining the estimated battery current includes determining the estimated battery current based on the battery voltage and based on the temperature of the battery.

19. A system for monitoring a status of a battery, the system comprising:

a controller configured to:

determine, based on a battery voltage and a battery current, a total energy loss in the battery through a plurality of charge cycles and a plurality of discharge cycles;

determine an energy loss due to an internal resistance of the battery during the plurality of charge cycles and the plurality of discharge cycles;

determine, based on a difference between the total energy loss and the energy loss due to the internal resistance of the battery, a self-discharge energy due to a self-discharge resistance of the battery;

generate, based on the self-discharge energy, a signal indicative of the self-discharge resistance of the battery;

determine, based on the self-discharge energy, a self-discharge metric;

determine the self-discharge metric exceeding a threshold value;

determine a total energy supplied to the battery; and calculate a self-discharge ratio between the self-discharge energy and the total energy supplied to the battery, wherein the signal indicative of the self-discharge resistance of the battery includes an alert signal indicating the battery having a deteriorated condition, wherein generating the signal indicative of the self-discharge resistance of the battery includes generating the alert signal based on the self-discharge metric exceeding the threshold value, and wherein the self-discharge metric includes the self-discharge ratio.

20. An apparatus for monitoring a status of a battery, the apparatus comprising:

a processor; and a memory including instructions that, when executed by the processor, cause the processor to:

determine, based on a battery voltage and a battery current, a total energy loss in the battery through a plurality of charge cycles and a plurality of discharge cycles;

determine an energy loss due to an internal resistance of the battery during the plurality of charge cycles and the plurality of discharge cycles;

determine, based on a difference between the total energy loss and the energy loss due to the internal resistance of the battery, a self-discharge energy due to a self-discharge resistance of the battery; and generate, based on the self-discharge energy, a signal indicative of the self-discharge resistance of the battery, wherein the instructions that cause the processor to generate the signal indicative of the self-discharge resistance of the battery further cause the processor to adjust at least one signal based on the self-discharge energy, and wherein the at least one signal includes at least one of a state-of-health signal and a state-of-charge signal.

21. The apparatus of claim 20, wherein the signal indicative of the self-discharge resistance of the battery includes an alert signal indicating the battery having a deteriorated condition.

* * * * *